(12) United States Patent
Kunieda

(10) Patent No.: US 12,261,156 B2
(45) Date of Patent: Mar. 25, 2025

(54) ELECTRONIC DEVICE

(71) Applicant: DENSO CORPORATION, Kariya (JP)

(72) Inventor: Hiroyoshi Kunieda, Kariya (JP)

(73) Assignee: DENSO CORPORATION, Kariya (JP)

( * ) Notice: Subject to any disclaimer, the term of this patent is extended or adjusted under 35 U.S.C. 154(b) by 411 days.

(21) Appl. No.: 17/839,928

(22) Filed: Jun. 14, 2022

(65) Prior Publication Data
US 2022/0310571 A1   Sep. 29, 2022
US 2023/0154904 A9   May 18, 2023

Related U.S. Application Data

(63) Continuation of application No. PCT/JP2021/000207, filed on Jan. 6, 2021.

(30) Foreign Application Priority Data

Feb. 5, 2020   (JP) ................................. 2020-017921

(51) Int. Cl.
*H01L 23/34*     (2006.01)
*H01L 23/00*     (2006.01)
*H01L 25/10*     (2006.01)

(52) U.S. Cl.
CPC ............ *H01L 25/105* (2013.01); *H01L 24/16* (2013.01); *H01L 2224/16225* (2013.01); *H01L 2225/1023* (2013.01); *H01L 2225/1058* (2013.01); *H01L 2924/15321* (2013.01); *H01L 2924/182* (2013.01); *H01L 2924/186* (2013.01); *H01L 2924/3511* (2013.01)

(58) Field of Classification Search
CPC ................ H01L 23/28; H01L 25/0657; H01L 2924/3511
USPC .................................................. 257/777, 686
See application file for complete search history.

(56) References Cited

U.S. PATENT DOCUMENTS

| | | | | |
|---|---|---|---|---|
| 5,229,960 A * | 7/1993 | De Givry | ............ | H01L 25/0652 257/E25.011 |
| 5,373,189 A * | 12/1994 | Massit | .................. | H01L 25/105 257/E25.011 |
| 6,717,251 B2 * | 4/2004 | Matsuo | ............... | H01L 25/0657 257/E25.023 |
| 6,762,488 B2 * | 7/2004 | Maeda | .............. | H01L 23/49833 257/E25.023 |
| 6,809,421 B1 * | 10/2004 | Hayasaka | ............... | H01L 25/50 257/621 |

(Continued)

FOREIGN PATENT DOCUMENTS

JP     2016-162815 A     9/2016

*Primary Examiner* — Nitin Parekh
(74) *Attorney, Agent, or Firm* — Posz Law Group, PLC

(57) ABSTRACT

An electronic device includes a circuit board, a lower IC package in which a lower IC chip is sealed on a lower package substrate by a lower resin portion being mounted on the substrate via a lower solder connection portion, and an upper IC package in which an upper IC chip is sealed on an upper package substrate by an upper resin portion being mounted on the lower IC package via an upper solder connection portion. The upper IC package is provided with a rigid body having a smaller linear expansion coefficient in a plane direction than that of the upper resin portion. The rigid body is arranged directly above a boundary between the lower IC chip and the lower resin portion.

15 Claims, 10 Drawing Sheets

(56) References Cited

U.S. PATENT DOCUMENTS

| | | | |
|---|---|---|---|
| 7,045,886 B2* | 5/2006 | Sawada | H01L 21/563 |
| | | | 257/E23.067 |
| 9,761,568 B2* | 9/2017 | Fang | H01L 24/17 |
| 2010/0230825 A1 | 9/2010 | von Kaenel | |
| 2012/0083052 A1 | 4/2012 | von Kaenel | |
| 2012/0139090 A1 | 6/2012 | Kim et al. | |
| 2012/0153471 A1 | 6/2012 | Watanabe et al. | |
| 2013/0032947 A1* | 2/2013 | Park | H01L 23/544 |
| | | | 257/777 |
| 2013/0207261 A1* | 8/2013 | Thacker | H01L 24/90 |
| | | | 257/738 |
| 2014/0103544 A1 | 4/2014 | Yokoyama et al. | |
| 2015/0024545 A1 | 1/2015 | Kim et al. | |
| 2015/0179618 A1* | 6/2015 | Jeong | H01L 21/56 |
| | | | 257/738 |
| 2019/0027300 A1 | 1/2019 | Mai et al. | |
| 2019/0273030 A1 | 9/2019 | Lim et al. | |

* cited by examiner

ELECTRONIC DEVICE

CROSS REFERENCE TO RELATED APPLICATIONS

This application is a continuation application of International Patent Application No. PCT/JP2021/000207 filed on Jan. 6, 2021, which designated the U.S. and based on and claims the benefits of priority of Japanese Patent Application No. 2020-017921 filed on Feb. 5, 2020. The entire disclosure of all of the above applications is incorporated herein by reference.

TECHNICAL FIELD

The present disclosure relates to an electronic device.

BACKGROUND

Conventionally, a package-on-package structure in which a plurality of IC packages are laminated on a circuit board has been provided.

SUMMARY

An object of the present disclosure is to improve a reliability of a product without restricting a wiring in a configuration in which a plurality of IC packages are laminated on a circuit board.

According to one aspect of the present disclosure, an electronic device includes a circuit board, a lower IC package in which a lower IC chip is sealed on a lower package substrate by a lower resin portion being mounted on the circuit board via a lower solder connection portion, and an upper IC package in which an upper IC chip is sealed on an upper package substrate by an upper resin portion being mounted on the lower IC package via an upper solder connection portion. The upper IC package is provided with a rigid body having a smaller linear expansion coefficient in a plane direction than that of the upper resin portion. The rigid body is arranged directly above a boundary between the lower IC chip and the lower resin portion.

BRIEF DESCRIPTION OF DRAWINGS

The above and other objects, features and advantages of the present disclosure will become more apparent from the following detailed description taken in conjunction with the accompanying drawings.
In the Drawings.

DETAILED DESCRIPTION

Figure 1:
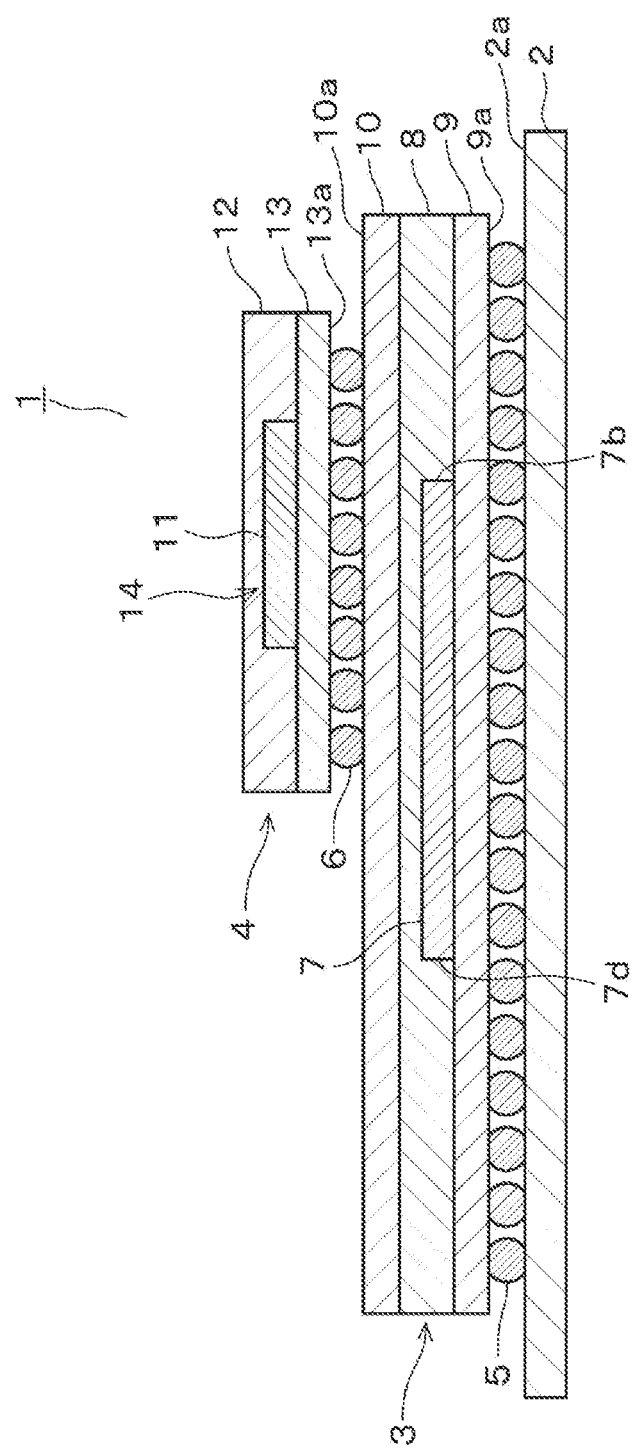
FIG. 1 is a longitudinal section view showing an electronic device according to a first embodiment.

In an assumable example, a package-on-package structure in which a plurality of IC packages are laminated on a substrate has been provided. IC means integrated circuit.

In the package-on-package structure, a lower IC package is mounted on a printed circuit board via a lower solder connection portion, and an upper IC package is mounted on the lower IC package via an upper solder connection portion. The IC package has a configuration in which an IC chip is sealed on a package substrate by a resin portion.

Since a linear expansion coefficient in a plane direction differs between the IC chip and the resin portion, there is a risk that the IC package will be warped due to bending at a boundary between the IC chip and the resin portion during a cooling/heating cycle. When the IC package is warped, the strain is concentrated on the solder connection portion arranged directly under the IC chip and the resin portion, and cracks are likely to occur. When cracks occur, the solder connection life is shortened and a reliability of the product is impaired. To deal with such problems, it is assumed that the solder connection portion is not placed directly under the boundary between the IC chip and the resin portion, but in such a configuration, there is new problems that the location and number of solder connection portions are limited, and the wiring is restricted.

An object of the present disclosure is to improve the reliability of a product without restricting the wiring in a configuration in which a plurality of IC packages are laminated on the substrate.

According to one aspect of the present disclosure, an electronic device includes a circuit board, a lower IC package in which a lower IC chip is sealed on a lower package substrate by a lower resin portion being mounted on the substrate via a lower solder connection portion, and an upper IC package in which an upper IC chip is sealed on an upper package substrate by an upper resin portion being mounted on the lower IC package via an upper solder connection portion. The upper IC package is provided with a rigid body having a smaller linear expansion coefficient in a plane direction than that of the upper resin portion. The rigid body is arranged directly above a boundary between the lower IC chip and the lower resin portion.

The rigid body having a smaller linear expansion coefficient in the plane direction than the upper resin portion is arranged immediately above the boundary between the lower IC chip and the lower resin portion. Bending occurs at the boundary between the lower IC chip and the lower resin portion during the cooling/heating cycle, but Immediately below the rigid body, bending is suppressed by the rigid body, and warpage generated in the lower IC package can be suppressed. As a result, it is possible to suppress the concentration of strain on the solder connection portion arranged directly below the boundary between the lower IC chip and the lower resin portion, and it is possible to suppress the occurrence of cracks. This makes it possible to improve the reliability of the product without restricting the wiring in the configuration in which a plurality of IC packages are laminated on the substrate.

Hereinafter, some embodiments of the electronic device will be described with reference to the drawings. In the embodiments, elements corresponding to those which have been described in the preceding embodiments are denoted by the same reference numerals, and redundant description may be omitted.

First Embodiment

A first embodiment will be described with reference to FIGS. 1 and 2. FIG. 1 shows a longitudinal cross section taken along a line A1-A2 of FIG. 2. An electronic device 1 is, for example, an in-vehicle electronic device mounted on a vehicle. Since the electronic device 1 is used in an in-vehicle environment, the guaranteed operating temperature is, for example, −30° C. to +80° C. The electronic device 1 has a package-on-package structure in which two IC packages 3 and 4 are laminated on a printed circuit board 2. Integrated circuit is referred to as IC, hereinafter. That is, the lower IC package 3 is mounted on the printed circuit board 2 via the plurality of lower solder connection portions 5, and the upper IC package 4 is mounted on the lower IC package 3 via the plurality of upper solder connection portions 6. The lower IC package 3 is electrically and physically connected to the printed circuit board 2 by a plurality of lower solder connecting portions 5. The upper IC package 4 is electrically and physically connected to the lower IC package 3 by a plurality of upper solder connecting portions 6. The lower IC package 3 and the upper IC package 4 are, for example, a SoC (System on Chip), a power supply IC (Integrated Circuit), a memory element, or the like.

The printed circuit board 2 is a multilayer board in which insulating base materials such as an epoxy resin containing glass fibers are laminated in multiple layers. Conductor patterns are formed on the surface of the multilayer board and between the layers, and a ground pattern is formed between the layers. As shown in FIG. 2, the printed circuit board 2 is rectangular in a plane and has a longitudinal direction (arrows X1 and X2 directions) and a lateral direction (arrows Y1 and Y2 directions). An upper surface 2a of the printed circuit board 2 is provided with a land for conduction corresponding to a plurality of lower solder balls of the lower IC package 3 and for soldering the lower IC package 3. Further, a solder resist layer is provided on the upper surface 2a of the printed circuit board 2 so as to cover a portion excluding the land for conduction.

The lower IC package 3 is a ball grid array package type (BGA type) semiconductor element, and a lower IC chip 7 is sealed on a lower package substrate 9 by a lower resin portion 8 and an upper package substrate 10 is mounted on the lower resin portion 8 so as to be formed as a thin rectangular package. The lower IC package 3 is also rectangular in a plane and has a longitudinal direction (arrows X1 and X2 directions) and a lateral direction (arrows Y1 and Y2 directions). The linear expansion coefficient in the plane direction is different between the lower IC chip 7 and the lower resin portion 8, the linear expansion coefficient in the plane direction of the lower IC chip 7 is relatively small, and the linear expansion coefficient in the plane direction of the lower resin portion 8 is relatively large. The lower IC chip 7 and the lower package substrate 9 are electrically connected by a bonding wire (not shown). The lower package substrate 9 and the upper package substrate 10 are electrically connected by a conductive portion (not shown) penetrating the lower resin portion 8. The plurality of lower solder balls described above are provided on a lower surface 9a of the lower package substrate 9. An upper surface 10a of the upper package substrate 10 is provided with a land for conduction corresponding to a plurality of upper solder balls of the upper IC package 4 and for soldering the upper IC package 4. Further, a solder resist layer is provided on the upper surface 10a of the upper package substrate 10 so as to cover a portion excluding the land for conduction.

The upper IC package 4 is a ball grid array package type semiconductor element like the lower IC package 3, and the upper IC chip 11 is sealed on the lower package substrate 13 by the upper resin portion 12 so as to be formed as a thin rectangular package. The linear expansion coefficient in the plane direction is different between the upper IC chip 11 and the upper resin portion 12, the linear expansion coefficient in the plane direction of the upper IC chip 11 is relatively small, and the linear expansion coefficient in the plane direction of the upper resin portion 12 is relatively large. The upper IC chip 11 and the lower package substrate 13 are electrically connected by a bonding wire (not shown). The plurality of upper solder balls described above are provided on a lower surface 13a of the lower package substrate 13.

In a process of mounting the lower IC package 3 on the printed circuit board 2 and mounting the upper IC package 4 on the lower IC package 3, the lower solder balls of the lower IC package 3 are overlapped while being aligned with the conduction lands on the printed circuit board 2. The upper solder balls of the upper IC package 4 are overlapped while being aligned with the conduction lands on the lower IC package 3. Finally, the solder connection is performed by heating while controlling the temperature. By heating, the solder balls are melted on the land for conduction and integrated with the land for conduction, and after that, by cooling, the solder is solidified to form the lower solder connection portion 5 and the upper solder connection portion 6. By forming the lower solder connection portion 5 and the upper solder connection portion 6, the lower IC package 3 is electrically and physically connected to the printed circuit board 2 via the lower solder connection portion 5. The upper IC package 4 is electrically and physically connected to the lower IC package 3 via the upper solder connection portion 6.

Figure 2:
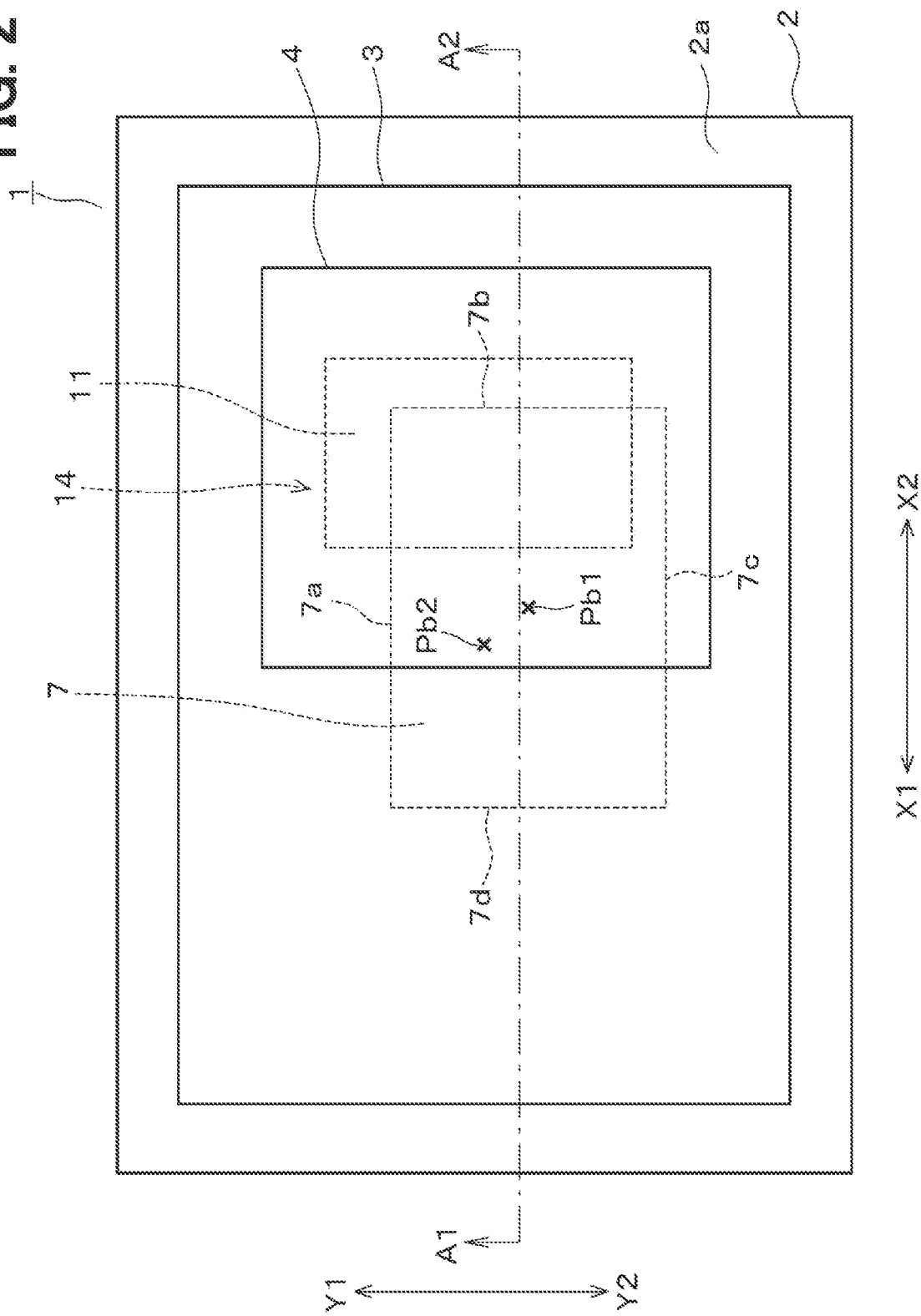
FIG. 2 is a plan view of the electronic device according to the first embodiment.

As shown in FIG. 2, a center Pb1 in the plane direction of the lower IC chip 7 is deviated from a center Pb2 in the plane direction of the lower IC package 3. That is, a vertical line from the center Pb2 in the plane direction of the lower IC package 3 to a long side 7a of the lower IC chip 7 is relatively short, and a vertical line from the center Pb2 in the plane direction of the lower IC package 3 to a long side 7c of the lower IC chip 7 is relatively long. A vertical line from the planar center Pb2 in the plane direction of the lower IC package 3 to a short side 7b of the lower IC chip 7 is relatively long, and a vertical line from the planar center Pb2 in the plane direction of the lower IC package 3 to a short side 7d of the lower IC package 7d is relatively short. Further, among the vertical lines from each side 7a to 7d of the lower IC chip 7, the vertical line to the short side 7b is the longest. That is, the short side 7b of the sides 7a to 7d of the lower IC chip 7 is farthest from the center Pb2 in the plane direction of the lower IC package 3.

As described above, in the configuration in which the linear expansion coefficient in the plane direction is different between the lower IC chip 7 and the lower resin portion 8, bending occurs at the boundary between the lower IC chip 7 and the lower resin portion 8 during the cooling/heating cycle, and there is a risk that the lower IC package 3 will be warped. When the lower IC package 3 is warped, the strain is concentrated on the solder connecting portion 5 arranged directly below the boundary between the lower IC chip 7 and the lower resin portion 8, and cracks are likely to occur.

When cracks occur, the solder connection life is shortened and the reliability of the product is impaired.

In this regard, in the above configuration, a rigid body 14 is arranged directly above a part of the boundary between the lower IC chip 7 and the lower resin portion 8. Specifically, the upper IC chip 11 is adopted as the rigid body 14, and the upper IC chip 11 is arranged directly above a part of the long side 7a and a part of the short side 7b of the lower IC chip 7. Therefore, the bending occurs at the boundary between the lower IC chip 7 and the lower resin portion 8 during the cooling/heating cycle, but the bending is suppressed by the upper IC chip 11 directly under the upper IC chip 11, and the warp generated in the lower IC package 3 is suppressed. As a result, the concentration of strain on the solder connection portion 5 arranged directly below the boundary between the lower IC chip 7 and the lower resin portion 8 is suppressed, and the occurrence of cracks is suppressed. The upper solder connection portion 6 is arranged directly above a part of the boundary between the lower IC chip 7 and the lower resin portion 8.

According to the first embodiment, the following effects can be exhibited. In the electronic device 1, an upper IC chip 11 having a smaller linear expansion coefficient in the plane direction than the upper resin portion 12 is arranged directly above a part of the boundary between the lower IC chip 7 and the lower resin portion 8. The bending occurs at the boundary between the lower IC chip 7 and the lower resin portion 8 during the cooling/heating cycle, but the bending is suppressed by the upper IC chip 11 directly under the upper IC chip 11, and the warp generated in the lower IC package 3 can be suppressed. As a result, it is possible to suppress the concentration of strain on the solder connection portion 5 arranged directly below the boundary between the lower IC chip 7 and the lower resin portion 8, and it is possible to suppress the occurrence of cracks. In the configuration in which the two IC packages 3 and 4 are laminated on the printed circuit board 2, it is possible to improve the reliability of the product without restricting the wiring Further, although warpage is likely to occur in the longitudinal direction in the lower IC package 3, the upper IC chip 11 is arranged directly above a part of the short side 7b orthogonal to the longitudinal direction of the lower IC package 3 among the sides 7a to 7d of the lower IC chip 7. Therefore, the warp generated in the lower IC package 3 can be suppressed more appropriately.

Further, in the lower IC package 3, warpage is more likely to occur as the distance from the center Pb2 in the plane direction increases, but the upper IC chip 11 is arranged directly above a part of the short side 7b farthest from the center Pb2 in the plane direction of the lower IC package 3 among the sides 7a to 7d of the lower IC chip 7. the farthest from the center Pb2 in the plane direction of the lower IC package 3 among the sides 7a to 7d of the lower IC chip 7. Therefore, the warp generated in the lower IC package 3 can be suppressed more appropriately.

Further, since the upper solder connection portion 6 is arranged directly above a part of the boundary between the lower IC chip 7 and the lower resin portion 8, the physical strength can be secured by the upper solder connection portion 6, and the warp generated in the lower IC package 3 can be suppressed more appropriately. Since the strain tends to concentrate on the upper solder connection portion 6 arranged directly above a part of the boundary between the lower IC chip 7 and the lower resin portion 8, it is desirable that the upper solder connection portion 6 is the solder connection portion which is not related to the wiring.

Second Embodiment

Figure 3:
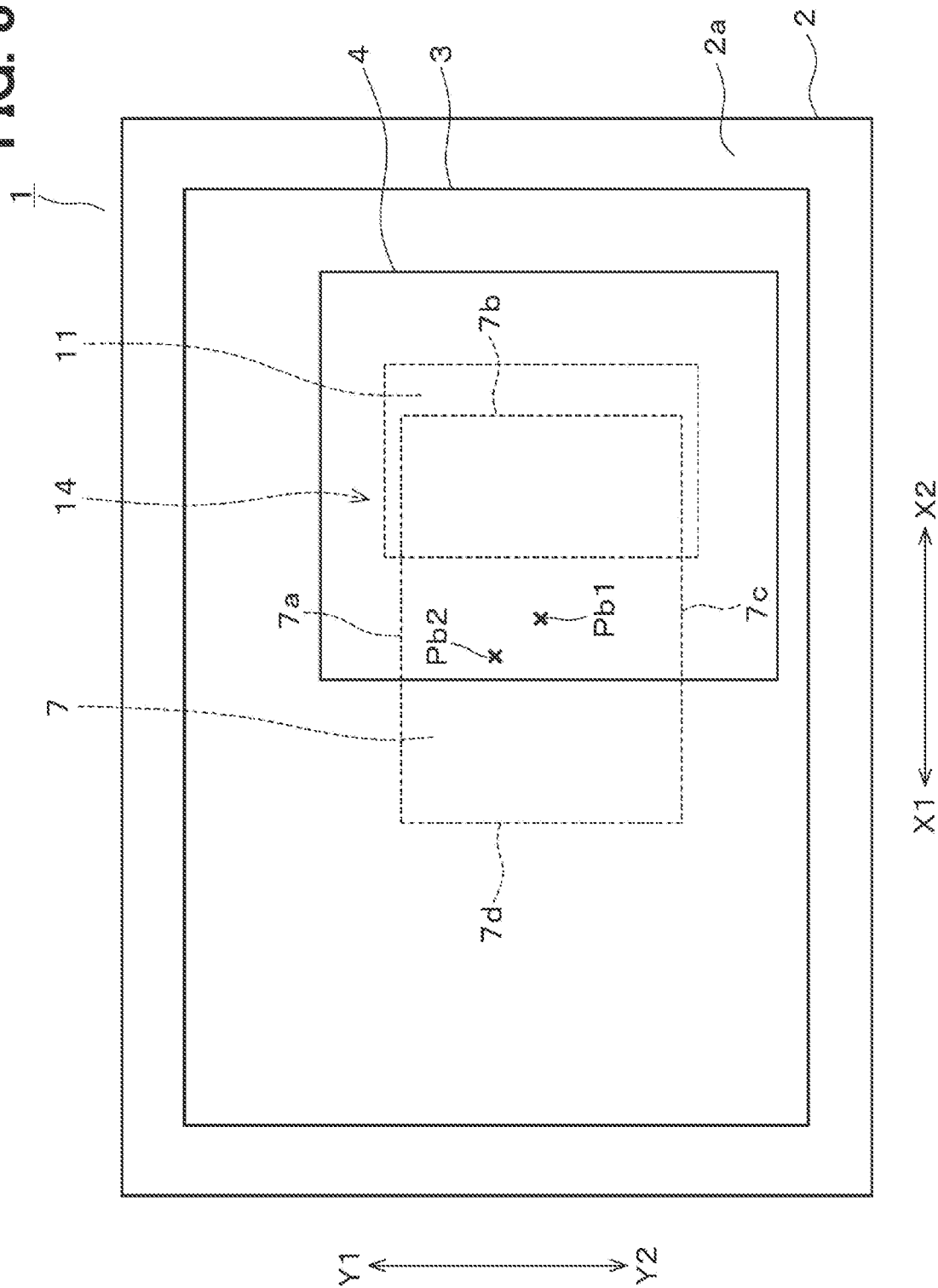
FIG. 3 is a plan view of an electronic device according to a second embodiment.

A second embodiment will be described with reference to FIG. 3. In the second embodiment, the position where the upper IC package 4 is mounted on the lower IC package 3 is different from the above-mentioned first embodiment. In the second embodiment, the upper IC chip 11 is arranged directly above a part of the long sides 7a and 7c of the lower IC chip 7 and the entire short side 7b.

According the second embodiment, the similar effects with the first embodiment can be obtained. Further, in the second embodiment, the upper IC chip 11 is arranged directly above the entire short side 7b of the lower IC chip 7, so that compared to the configuration in which the upper IC chip 11 is arranged directly above a part of the short side 7b, it is possible to more appropriately suppress the concentration of strain on the solder connection portion 5 arranged directly below the short side 7b.

Third Embodiment

Figure 4:
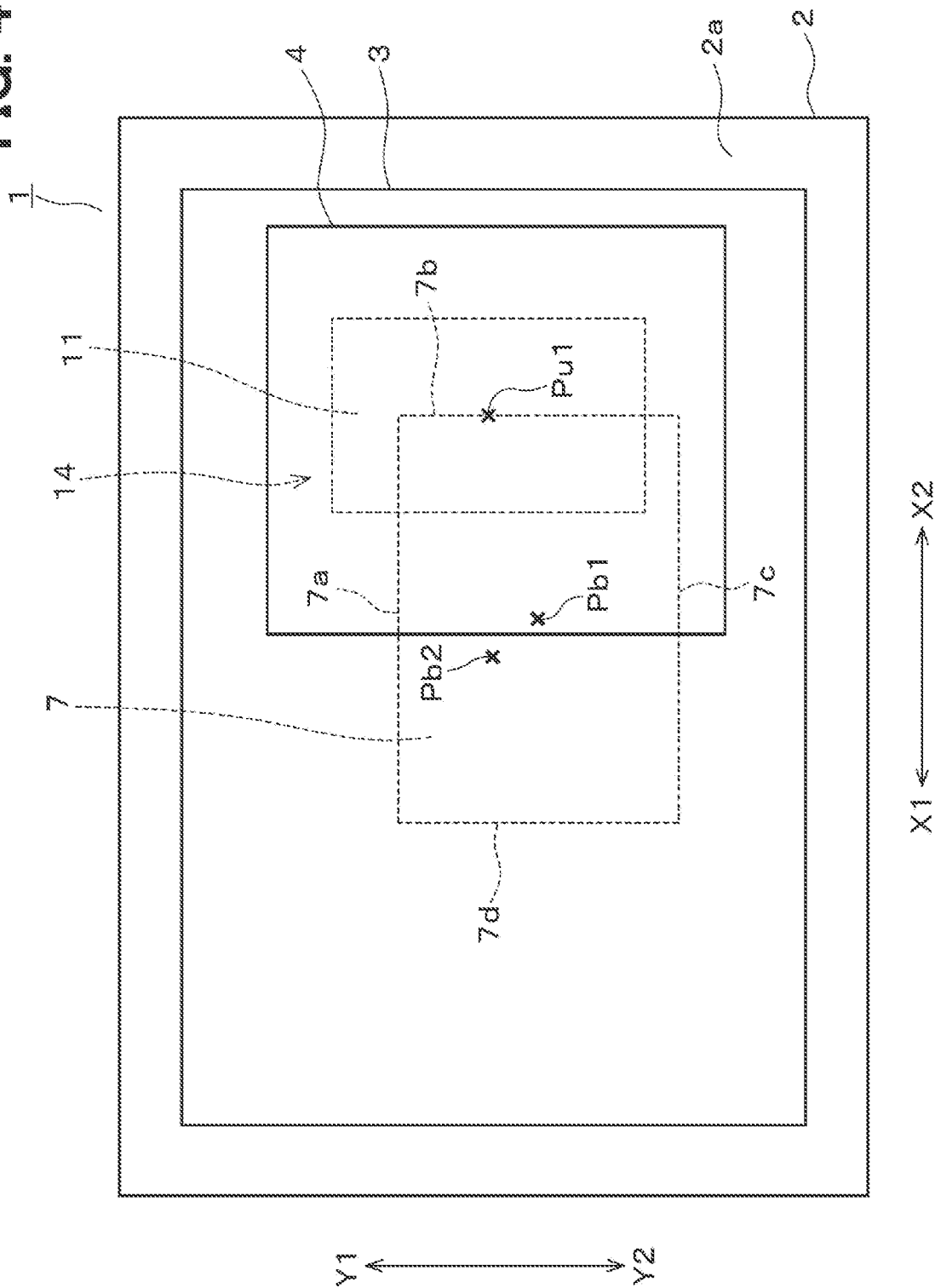
FIG. 4 is a plan view of an electronic device according to a third embodiment.

A third embodiment will be described with reference to FIG. 4. In the third embodiment, the position where the upper IC package 4 is mounted on the lower IC package 3 is also different from the above-mentioned first embodiment. In the third embodiment, the upper IC chip 11 is arranged directly above the part of the long side 7a and the part of the short side 7b of the lower IC chip 7, and a center Pu1 in the plane direction of the IC chip 11 is arranged directly above the part of the short side 7b.

According the third embodiment, the similar effects with the first embodiment can be obtained. Further, in the third embodiment, since the center Pu1 in the plane direction of the upper IC chip 11 is arranged directly above a part of the short side 7b, it is possible to more appropriately suppress the concentration of distortion on the connection portion 5 arranged directly below the part of the short side 7b.

Fourth Embodiment

Figure 5:
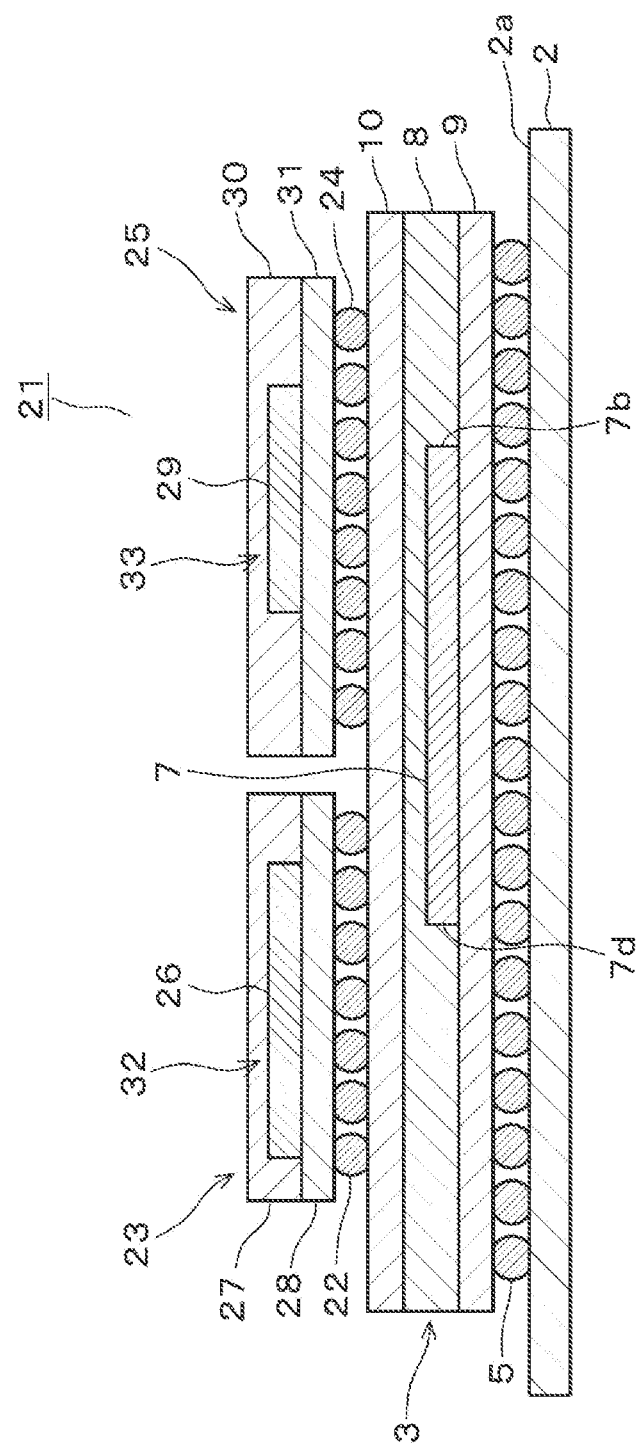
FIG. 5 is a longitudinal section view showing an electronic device according to a fourth embodiment.

The fourth embodiment will be described with reference to FIGS. 5 and 6. FIG. 5 shows a longitudinal cross section taken along a line A3-A4 of FIG. 6. The fourth embodiment is different from the first embodiment described above in that a plurality of upper IC packages are mounted on the lower IC package.

In the electronic device 21, the lower IC package 3 is mounted on the printed circuit board 2 via the plurality of lower solder connection portions 5. The first upper IC package 23 is mounted on the lower IC package 3 via the plurality of first upper solder connection portions 22, and the second upper IC package 25 is mounted on the lower IC package 3 via the plurality of second upper solder connection portions 24.

The first upper IC package 23 has the same configuration as the upper IC package 4 described in the first embodiment, and the first upper IC chip 26 is sealed on the first lower package substrate 28 by the first upper resin portion 27 so as to be formed as a thin rectangular package. The second upper IC package 25 also has the same configuration as the upper IC package 4 described in the first embodiment, and the second upper IC chip 29 is sealed on the second lower package substrate 31 by the second upper resin portion 30 so as to be formed as a thin rectangular package.

Figure 6:
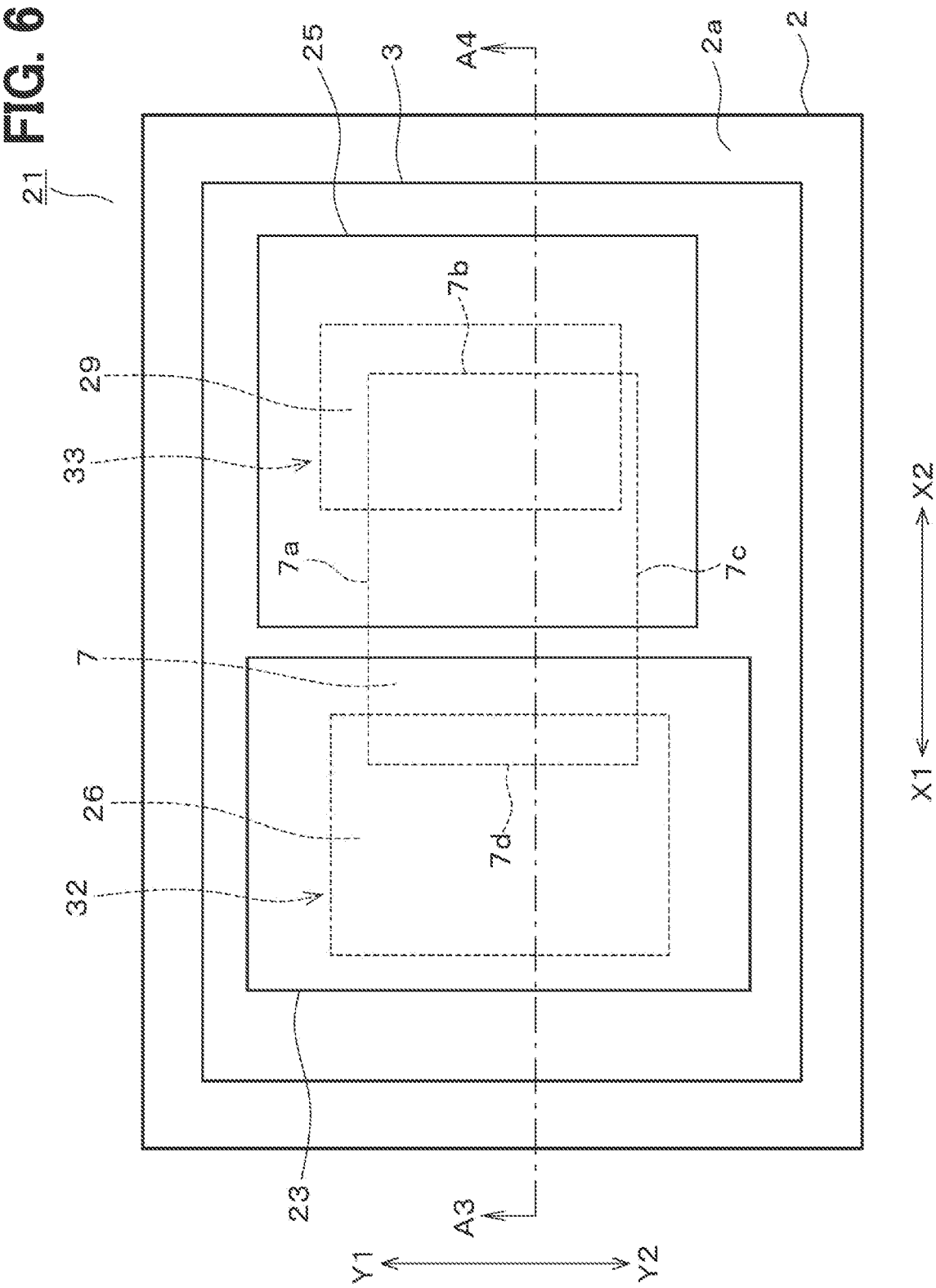
FIG. 6 is a plan view of the electronic device according to the fourth embodiment.

As shown in FIG. 6, the rigid bodies 32 and 33 are arranged directly above a part of the boundary between the lower IC chip 7 and the lower resin portion 8. Specifically, the first upper IC chip 26 is adopted as the rigid body 32, and the first upper IC chip 26 is arranged directly above a part of the long sides 7a and 7c of the lower IC chip 7 and the entire short side 7d. Therefore, the bending occurs at the boundary between the lower IC chip 7 and the lower resin portion 8 during the cooling/heating cycle, but the bending is suppressed by the first upper IC chip 26 directly under the first upper IC chip 26, and the warp generated in the lower IC package 3 is suppressed. Further, the second upper IC chip 29 is adopted as the rigid body 33, and the second upper IC chip 29 is arranged directly above a part of the long side 7a and the part of the short side 7b of the lower IC chip 7. Therefore, the bending occurs at the boundary between the lower IC chip 7 and the lower resin portion 8 during the cooling/heating cycle, but the bending is suppressed by the second upper IC chip 29 directly under the second upper IC chip 29, and the warp generated in the lower IC package 3 is suppressed. As a result, the concentration of strain on the solder connection portion 5 arranged directly below the boundary between the lower IC chip 7 and the lower resin portion 8 is suppressed, and the occurrence of cracks is suppressed. In this case, at both ends in the long side direction of the lower IC chip 7, bending is suppressed at the boundary between the lower IC chip 7 and the lower resin portion 8, so that the warp generated in the lower IC package 3 is suppressed more appropriately.

According to the fourth embodiment, the following effects can be exhibited. In the electronic device 21, the first upper IC chip 26 and the second upper IC chip 29 are arranged directly above a part of the boundary between the lower IC chip 7 and the lower resin portion 8. Bending occurs at the boundary between the lower IC chip 7 and the lower resin portion 8 during the cooling/heating cycle, but the bending is suppressed by the first upper IC chip 26 and the second upper IC chip 29 directly below the first upper IC chip 26 and the second upper IC chip 29, and the warp generated in the lower IC package 3 can be suppressed. As a result, it is possible to suppress the concentration of strain on the solder connection portion 5 arranged directly below the boundary between the lower IC chip 7 and the lower resin portion 8, and it is possible to suppress the occurrence of cracks. As a result, even in a configuration in which two upper IC packages 23 and 25 are mounted on the lower IC package 3, it is possible to improve the reliability of the product without restricting the wiring. The same applies to the configuration in which three or more upper IC packages are mounted on the lower IC package 3.

Fifth Embodiment

Figure 7:
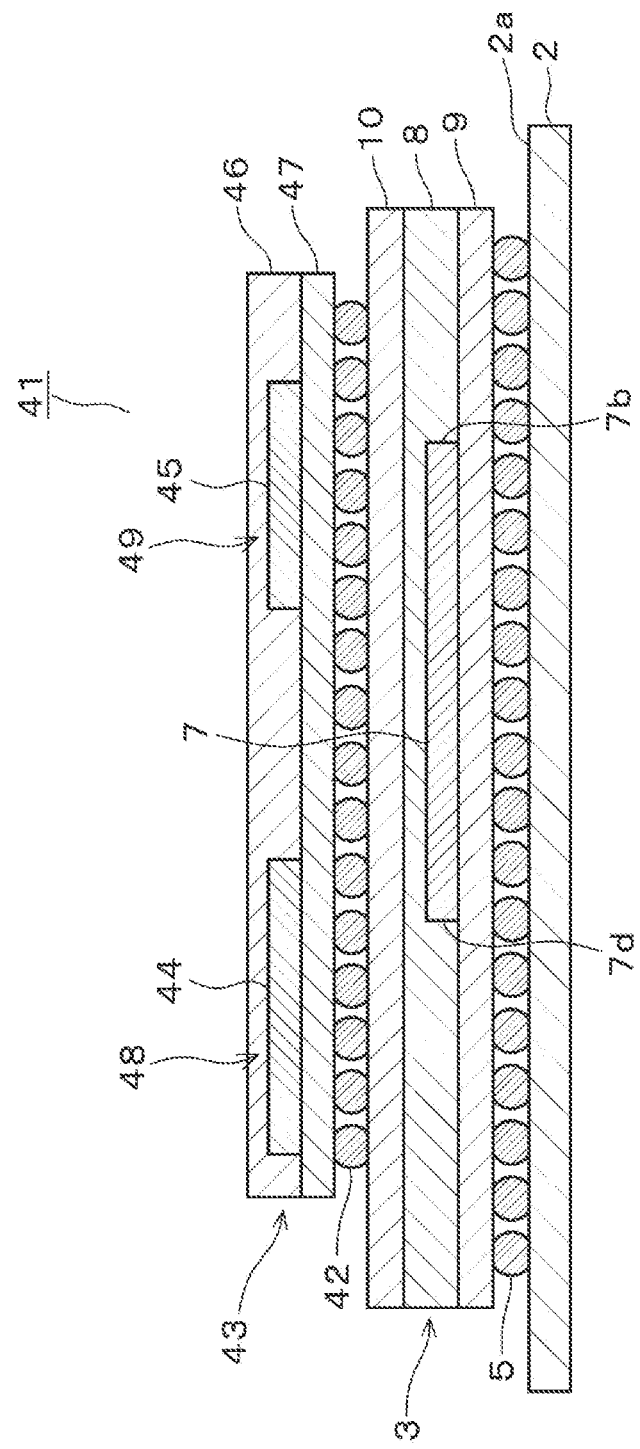
FIG. 7 is a longitudinal section view showing an electronic device according to a fifth embodiment.

A fifth embodiment will be described with reference to FIGS. 7 and 8. FIG. 7 shows a longitudinal cross section taken along a line A5-A6 of FIG. 8. The fifth embodiment is different from the first embodiment described above in that a plurality of upper IC chips are sealed in one upper IC package.

In the electronic device 41, the lower IC package 3 is mounted on the printed circuit board 2 via the plurality of lower solder connection portions 5, and the upper IC package 43 is mounted on the lower IC package 3 via the plurality of upper solder connection portions 42.

The upper IC package 43 has a different configuration from the upper IC package 4 described in the first embodiment, and the first upper IC chip 44 and the second upper IC chip 45 are sealed on the lower package substrate 47 by the upper resin portion 46 so as to be formed as a thin rectangular package.

Figure 8:
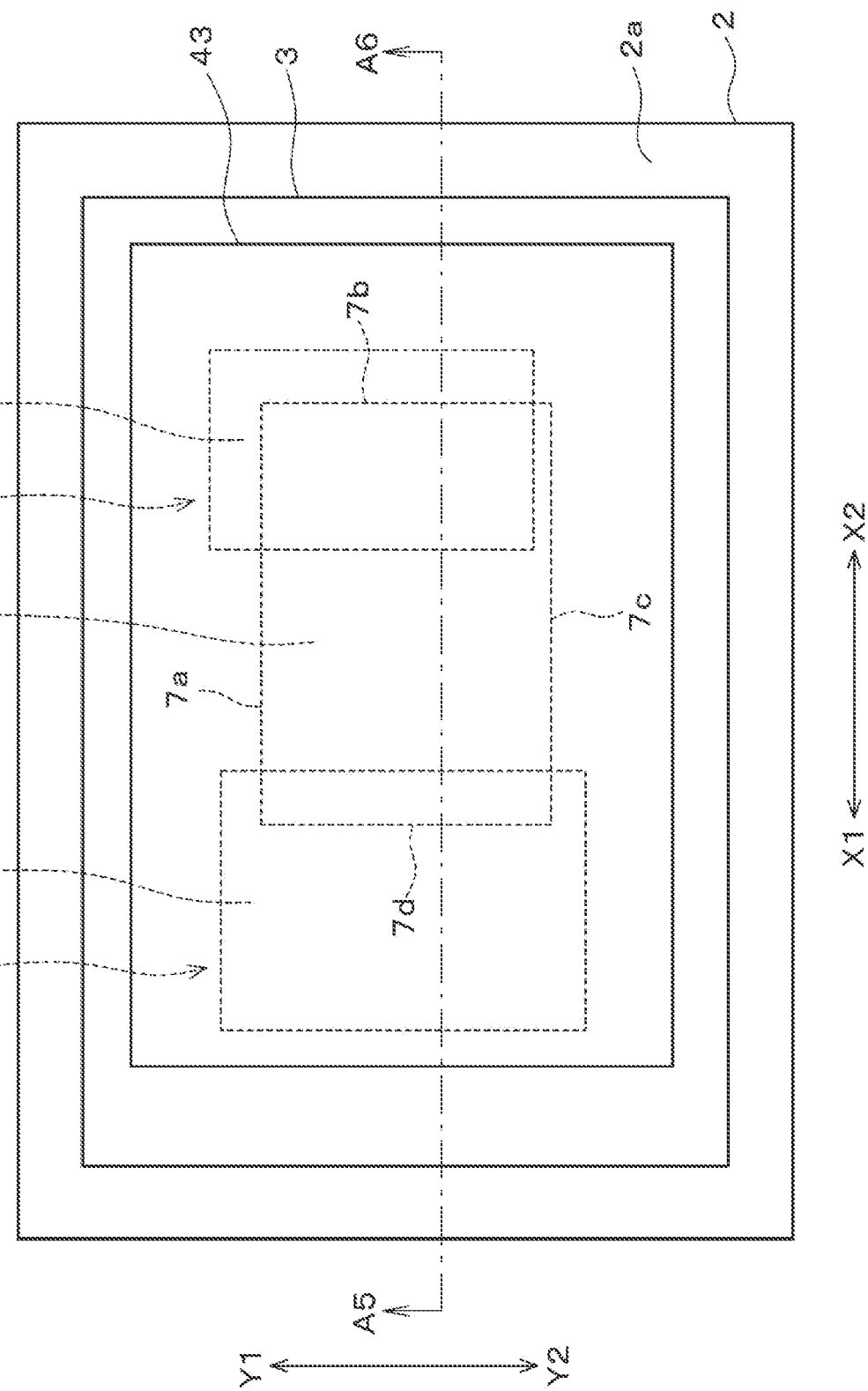
FIG. 8 is a plan view of the electronic device according to the fifth embodiment.

As shown in FIG. 8, the rigid bodies 48 and 49 are arranged directly above a part of the boundary between the lower IC chip 7 and the lower resin portion 8. Specifically, the first upper IC chip 44 is adopted as the rigid body 48, and the first upper IC chip 44 is arranged directly above a part of the long sides 7a and 7c of the lower IC chip 7 and the entire short side 7d. Therefore, the bending occurs at the boundary between the lower IC chip 7 and the lower resin portion 8 during the cooling/heating cycle, but the bending is suppressed by the first upper IC chip 44 directly under the first upper IC chip 44, and the warp generated in the lower IC package 3 is suppressed. Further, the second upper IC chip 45 is adopted as the rigid body 49, and the second upper IC chip 45 is arranged directly above a part of the long side 7a and the part of the short side 7b of the lower IC chip 7. Therefore, the bending occurs at the boundary between the lower IC chip 7 and the lower resin portion 8 during the cooling/heating cycle, but the bending is suppressed by the second upper IC chip 45 directly under the second upper IC chip 45, and the warp generated in the lower IC package 3 is suppressed. As a result, the concentration of strain on the solder connection portion 5 arranged directly below the boundary between the lower IC chip 7 and the lower resin portion 8 is suppressed, and the occurrence of cracks is suppressed. Also in this case, at both ends in the long side direction of the lower IC chip 7, bending is suppressed at the boundary between the lower IC chip 7 and the lower resin portion 8, so that the warp generated in the lower IC package 3 is suppressed more appropriately.

According to the fifth embodiment, the following effects can be exhibited. In the electronic device 41, the first upper IC chip 44 and the second upper IC chip 45 are arranged directly above a part of the boundary between the lower IC chip 7 and the lower resin portion 8. Bending occurs at the boundary between the lower IC chip 7 and the lower resin portion 8 during the cooling/heating cycle, but the bending is suppressed by the first upper IC chip 44 and the second upper IC chip 45 directly below the first upper IC chip 44 and the second upper IC chip 45, and the warp generated in the lower IC package 3 can be suppressed. As a result, it is possible to suppress the concentration of strain on the solder connection portion 5 arranged directly below the boundary between the lower IC chip 7 and the lower resin portion 8, and it is possible to suppress the occurrence of cracks. Thereby, even in the configuration in which the two upper IC chips 44 and 45 are sealed in the upper IC package 43, the wiring is not restricted and the reliability of the product can be improved. The same applies to the configuration in which three or more upper IC chips are sealed in the upper IC package 43.

Sixth Embodiment

Figure 9:
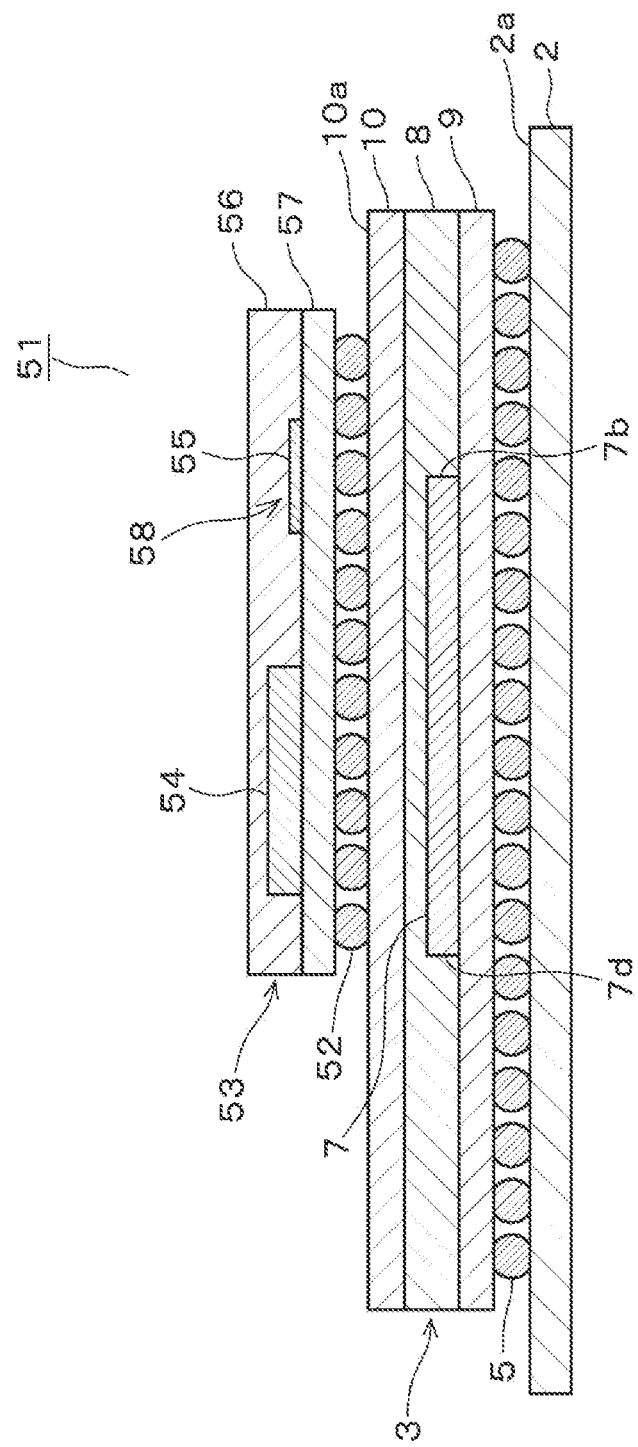
FIG. 9 is a longitudinal section view showing an electronic device according to a sixth embodiment.

A sixth embodiment will be described with reference to FIGS. 9 and 10. FIG. 9 shows a longitudinal cross section taken along a line A7-A8 of FIG. 10. The sixth embodiment is different from the first embodiment described above in that a member different from the upper IC chip is used as the rigid body.

In the electronic device 51, the lower IC package 3 is mounted on the printed circuit board 2 via the plurality of lower solder connection portions 5, and the upper IC package 53 is mounted on the lower IC package 3 via the plurality of upper solder connection portions 52.

The upper IC package 53 has a different configuration from the upper IC package 4 described in the first embodiment, and the upper IC chip 54 and a flat plate member 55 are sealed on the lower package substrate 57 by the upper resin portion 56 so as to be formed as a thin rectangular package. The flat plate member 55 is made of a material having a linear expansion coefficient in the plane direction similar to that of the upper IC chip 54. That is, the linear expansion coefficient in the plane direction of the flat plate member 55 is smaller than the linear expansion coefficient in the plane direction of the upper resin portion 56.

Figure 10:
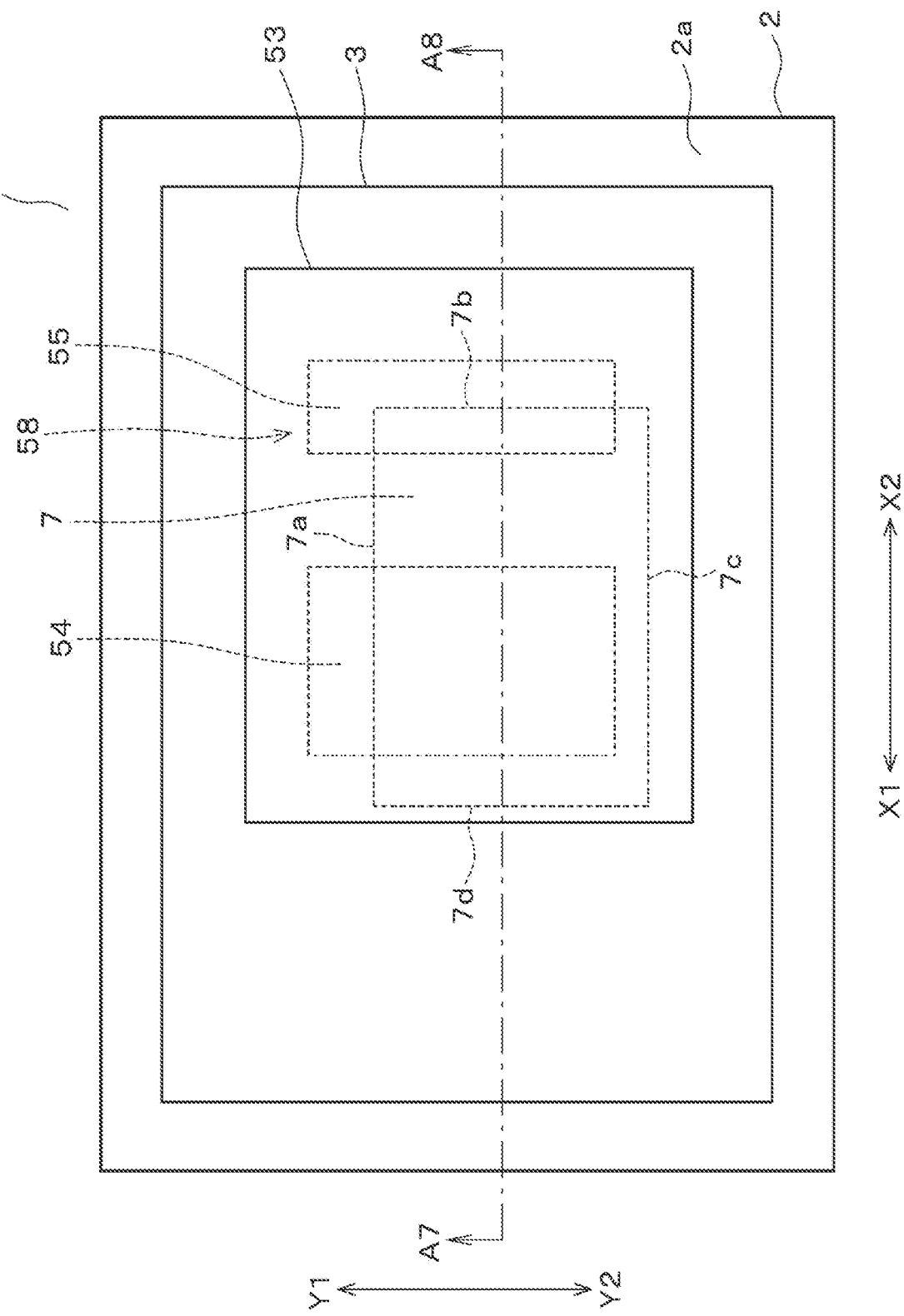
FIG. 10 is a plan view showing the electronic device according to the sixth embodiment.

As shown in FIG. 10, the rigid body 58 is arranged directly above a part of the boundary between the lower IC chip 7 and the lower resin portion 8. Specifically, the flat plate member 55 is adopted as the rigid body 58, and the flat plate member 55 is arranged directly above a part of the long side 7a and a part of the short side 7b of the lower IC chip 7. Therefore, the bending occurs at the boundary between the lower IC chip 7 and the lower resin portion 8 during the cooling/heating cycle, but the bending is suppressed by the flat plate member 55 directly under the flat plate member 55, and wrap generated in the lower IC package 3 is suppressed.

According to the sixth embodiment, the following effects can be exhibited. In the electronic device 51, the flat plate member 55 having a smaller linear expansion coefficient in the plane direction than that of the upper resin portion 56 is arranged directly above a part of the boundary between the lower IC chip 7 and the lower resin portion 8. Bending occurs at the boundary between the lower IC chip 7 and the lower resin portion 8 during the cooling/heating cycle, but Immediately below the flat plate member 55, bending is suppressed by the flat plate member 55, and warpage generated in the lower IC package 3 can be suppressed. As a result, it is possible to suppress the concentration of strain on the solder connection portion 5 arranged directly below the boundary between the lower IC chip 7 and the lower resin portion 8, and it is possible to suppress the occurrence of cracks. As a result, even in a configuration in which the flat plate member 55, which is a member different from the upper IC chip 54, is used as the rigid body, the wiring is not restricted and the reliability of the product can be improved. The number and size of the flat plate members 55 are arbitrary.

Other Embodiments

Although the present disclosure has been described in accordance with the examples, it is understood that the present disclosure is not limited to such examples or structures. The present disclosure encompasses various modifications and variations within the scope of equivalents. Additionally, various combinations and configurations, as well as other combinations and configurations including more, less, or only a single element, are within the scope and spirit of the present disclosure.

Although the configuration in which the IC packages are laminated in two layers on the printed circuit board is exemplified, the configuration in which the IC packages are laminated in three or more layers on the printed circuit board may be used. In that case, the configuration of the embodiment may be applied to any upper IC package and lower IC package that are in an upper and lower relationship.

What is claimed is:
1. An electronic device, comprising:
a circuit board;
a lower integrated circuit (IC) package in which a lower IC chip is sealed on a lower package substrate by a lower resin portion being mounted on the circuit board via a lower solder connection portion; and
an upper IC package in which an upper IC chip is sealed above an upper package substrate by an upper resin portion being mounted on the circuit board via an upper solder connection portion; wherein
a rigid body having a smaller coefficient of linear expansion in a plane direction than that of the upper resin portion is provided in the upper IC package, and
the rigid body is arranged directly above a boundary between the lower IC chip and the lower resin portion.
2. The electronic device according to claim 1, wherein
the lower IC chip has a rectangular shape, and
the rigid body is arranged directly above a part of any one side of the lower IC chip.
3. The electronic device according to claim 1, wherein
the lower IC chip has a rectangular shape, and
the rigid body is arranged directly above an entire side of any one side of the lower IC chip.
4. The electronic device according to claim 1, wherein
a center of the rigid body in the plane direction is arranged directly above any one side of the lower IC chip.
5. The electronic device according to claim 1, wherein
the rigid body is arranged directly above any one of the four sides of the lower IC chip, which is farthest from a center in the plane direction of the lower IC package.
6. The electronic device according to claim 1, wherein
a plurality of upper IC packages are provided.
7. The electronic device according to claim 6, wherein
the plurality of upper IC packages includes a first upper IC package having a first upper IC chip sealed on a first upper package substrate by a first upper resin portion, and being mounted on the lower IC package via a first upper solder connection portion, and a second IC package having a second upper IC chip sealed on a second upper package substrate by a second upper resin portion, and being mounted on the lower IC package via a second upper solder connection portion, and
the first upper IC package and the second upper IC package are arranged in the plane direction.
8. The electronic device according to claim 1, wherein
a plurality of upper IC chips are provided.
9. The electronic device according to claim 8, wherein
the plurality of upper IC chips include a first upper IC chip and a second upper IC chip, and the first upper IC chip and the second upper IC chip are arranged in the plane direction.
10. The electronic device according to claim 1, wherein
the rigid body is the upper IC chip.
11. The electronic device according to claim 1, wherein
the rigid body is a separate member from the upper IC chip.
12. The electronic device according to claim 1, wherein
the upper solder connection portion is arranged directly above a boundary between the lower IC chip and the lower resin portion.
13. The electronic device according to claim 12, wherein
the upper solder connection portion arranged directly above the boundary between the lower IC chip and the lower resin portion is not used as a wiring.
14. An electronic device, comprising:
a circuit board;
a lower integrated circuit (IC) package in which a lower IC chip is sealed on a lower package substrate by a lower resin portion being mounted on the circuit board via a lower solder connection portion; and
an upper IC package in which an upper IC chip is sealed on an upper package substrate by an upper resin portion being mounted on the circuit board via an upper solder connection portion, wherein a rigid body having a smaller coefficient of linear expansion in a plane direction than that of the upper resin portion is provided in the upper IC package, the lower IC chip is a rectangular shape, the rigid body is disposed directly above an entire length of one side of the lower IC chip at a boundary between the lower IC chip and the lower resin portion, and the upper solder connection portion is disposed directly above a boundary between the lower IC chip and the lower resin portion.

15. The electronic device according to claim 14, wherein the upper solder connection portion disposed directly above the boundary between the lower IC chip and the lower resin portion is not used as a wiring.

* * * * *